Inventor:
Warren De Sorbo,
by [signature]
His Attorney.

Dec. 17, 1968 W. DE SORBO 3,416,917

SUPERCONDUCTOR QUATERNARY ALLOYS WITH HIGH CURRENT CAPACITIES AND HIGH CRITICAL FIELD VALUES

Original Filed Nov. 13, 1962 2 Sheets-Sheet 2

Inventor:
Warren De Sorbo, by [signature]

His Attorney.

United States Patent Office 3,416,917

Patented Dec. 17, 1968

3,416,917

SUPERCONDUCTOR QUATERNARY ALLOYS WITH HIGH CURRENT CAPACITIES AND HIGH CRITICAL FIELD VALUES

Warren De Sorbo, Ballston Lake, N.Y., assignor to General Electric Company, a corporation of New York Original application Nov. 13, 1962, Ser. No. 237,158, Divided and this application Apr. 18, 1966, Ser. No. 543,173

3 Claims. (Cl. 75—174)

ABSTRACT OF THE DISCLOSURE

New superconducting intermetallic compounds such as tin, aluminum, silicon, or gallium with niobium, titanium, tantalum or vanadium alloys containing at least two metals selected from the group consisting of zirconuim, molybdenum, uranium and rhenium.

This is a division of my copending patent application Ser. No. 237,158, filed Nov. 13, 1962, now abandoned, and assigned to the assignee hereof.

This invention relates generally to superconducting materials and their preparation and use and is more particularly concerned with novel superconducting intermetallic compounds having high critical field values and high current-carrying capacities.

Superconductivity is that characteristic of certain materials which permits them to conduct electric currents without resistance. Thus, an electric current flowing through a superconducting circuit will flow undiminished by resistance losses for as long as the conducting elements of the circuit are maintained in their superconducting state. A superconducting material exhibits this characteristic only when its temperature is below the superconducting critical temperature of the material and then only if it is not subject either to a magnetic field greater than the superconducting critical magnetic field of the material or to an electric current greater than the superconducting critical current of the material. Accordingly, superconductivity may be quenched by increasing the temperature, increasing the magnetic field or the current to which the superconducting element is subjected and quenching of this state may occur abruptly or more gradually depending upon the particular material, i.e., the relative breadth of its superconducting transition state in terms of temperature, magnetic field or current.

No material known heretofore has been superconductive at temperatures in excess of about 18° K. and there are relatively few elemental materials which are superconducting at temperatures higher than 4° K. It has, however, been possible recently to produce materials having much higher critical magnetic field values and critical current values than those previously known. Thus, in my copending patent application, Ser. No. 149,590, filed Nov. 2, 1961, new products having uniquely high critical magnetic field and critical current values are disclosed and claimed together with processes for their production. Prior efforts to substantially increase the superconducting critical temperatures of various materials have not, however, been similarly successful. Nevertheless, there does not appear to be any scientific reason why superconducting critical temperatures cannot be raised and superconducting critical magnetic fields and critical current values still further substantailly increased. In efforts to test this assumption, I have made certain discoveries and inventions which have opened the way to some of these goals and may lead to still other significant achievements.

One of the discoveries that I have made is that it is important in the attainment of new superconducting properties that the atom of a solute metal of the reagent alloy employed to produce an intermetallic compound be substantially larger than the atom of the base or principal metal of the alloy.

Another discovery on which this invention is predicated is that it is important in maximizing the upper critical magnetic field ($H_N$) value of intermetallic compounds that two metal components of the reagent alloy differ from each other in valence by at least an order of one.

Another factor having an important bearing upon the superconducting upper critical magnetic field ($H_N$) value of intermetallic compounds is, I have found, the resistivity in the normal state of intermetallic compound. Accordingly, the superconducting critical temperature of the metals and alloys used in the production of the intermetallic compounds of this invention should be as high as possible, consistent with the limitations imposed by other criteria set forth herein.

Still another discovery is the importance of the coefficient of the linear term of the electronic specific heat of the ultimate intermetallic compound. This term is proportional to the density of state, that is, it serves as a general indication of the number of electrons participating in the event.

In the application of the foregoing principles and rules evolving from these discoveries, I have invented a number of new intermetallic compounds and classes thereof having in common unique superconducting characteristics and combinations of such characteristics. These new superconducting materials and compositions in all cases are the reaction products of binary, ternary or other alloys with a metal or metals.

Broadly described, the new intermetallic compounds are the products of reaction between tin, aluminum, silicon and gallium with an alloy of a parent metal having a superconducting critical temperature above 4.0° K. Preferably, the parent metal will be niobium, vanadium, tantalum or technetium and the proportion or ratio or amount of the solute metal or metals in these reagent alloys is that which represents the maximum value of the coefficient of the linear term of the electronic specific heat of the particular alloy.

In general, these new intermetallic compound superconductors will take the form of films or more massive bodies, but it is to be understood that they may also be useful in particulate form, being capable of exhibiting the novel superconducting properties described above so long as the individual particles of the intermetallic compound are of cross-sectional dimension greater than 10 microns. This means, therefore, as a practical matter that when used in finely-divided or powder form, these new superconducting materials should in major part in mixtures consist of particles which have a thickness or a diameter not less than 10 microns. Finer material has been found to have only a small fractional part of the magnetic hysteresis of the larger particles and thus to be of limited utility for many purposes for which the materials of this invention are especially suitable. Incidentally, however, the $H_N$ or upper critical field value of these finer materials will be the same as the larger particles or bodies of the same composition, size playing no part in this particular property of these new intermetallic compounds.

In general, in the ternary, quaternary and quintary and higher reagent alloys used to produce these new intermetallic compounds, two of the solute metals will differ from each other in valance by at least an order of two. Further, one of the solute metals, and not necessarily one of the two stated just above, will be selected so that its atom diameter will be larger than the atom diameter of the parent metal of the alloy by at least 0.05 Angstrom. Still further, in these higher reagent alloys, the aggregate amount of the solute metals will in every instance be less than the amount of the parent metal, it being essential as described above in accordance with my discoveries that the parent metal be in major proportion in all these alloys.

Those skilled in the art will gain a further understanding of this invention from the detailed description and working examples set out below and from the drawings accompanying and forming a part of this specification, in which.

Figure 4:
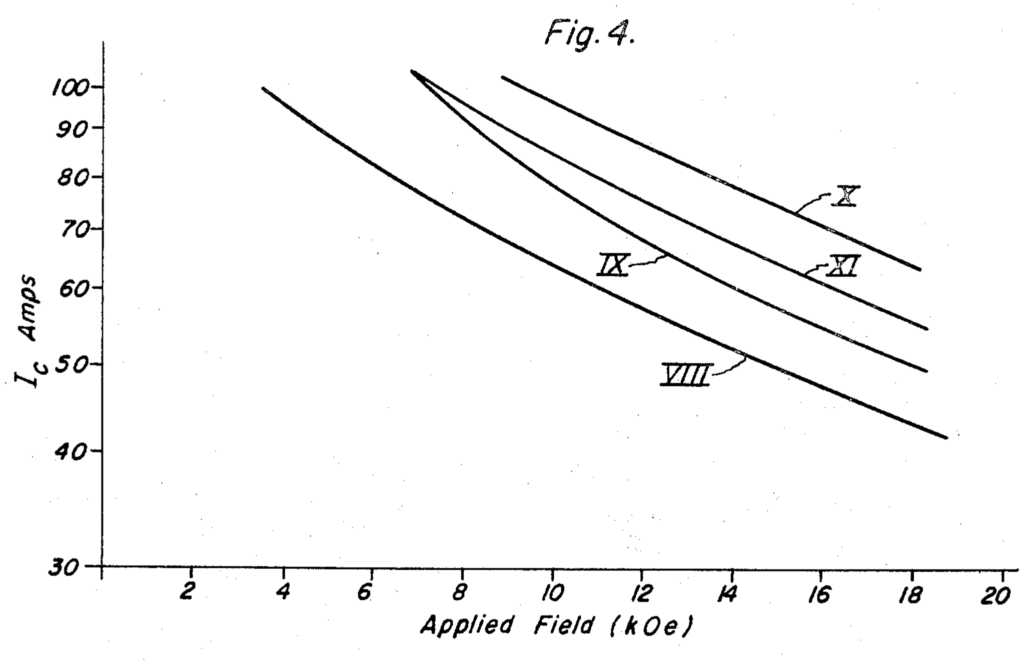
Figure 5:
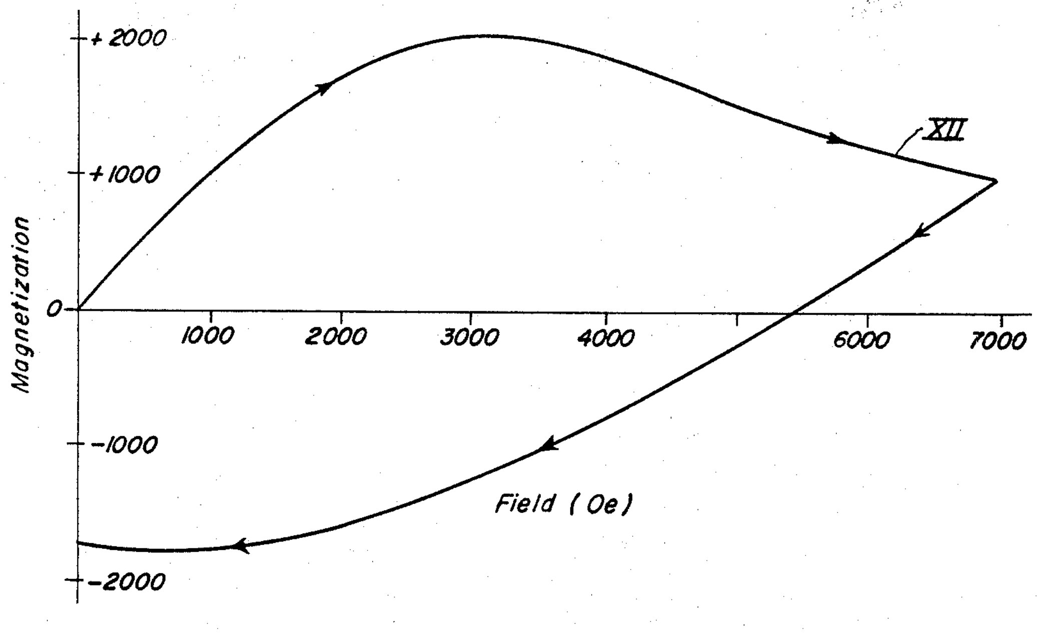

FIG. 4 is a chart in which transverse applied field in kilo-oersteds is ploted against superconducting critical current in amperes for arc-melting niobium and three different niobium-base solid solution alloys, all having been subjected to contact with tin vapor at 960° C. for one hour; and FIG. 5 is a chart in which magnetization ($-4\pi M$) is plotted against field (oersteds) for a nobium alloy containing 9.5 atomic percent zirconium alloy and for an intermetallic compound produced by reacting that alloy with tin.

Figure 1:
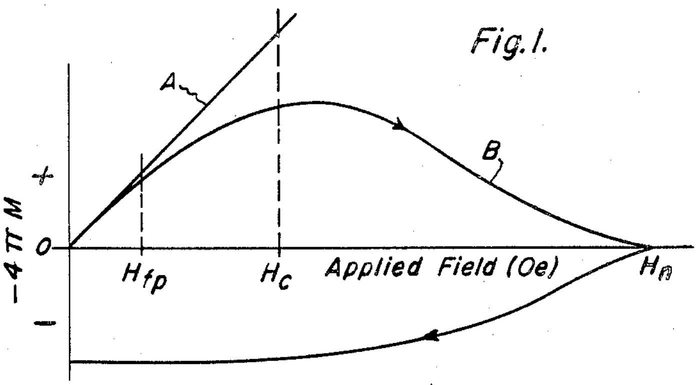
FIG. 1 is a chart on which magnetization ($-4\pi M$) is plotted against applied field (kilo-oersteds), two curves representing the results typical of tests of a "soft" superconductor and a "hard" superconductor.

The magnetic characteristics of "soft" and "hard" superconductors are illustrated in FIG. 1 wherein Curve A represents a "soft" material and Curve B represents a "hard" one. In the "soft" case, magnetization is shown to increase in proportion to the increase in the applied magnetic field until the level of that field reaches the value designated $H_c$, whereupon the superconducting state is instantly quenched and the material or body returns to its normal state of electrical resistance. If the temperature is maintained below the superconducting critical temperature of the material and the applied field is gradually diminished to the $H_c$ point, the superconducting state is instantly re-established in the material and further decreases in the applied field result in precise retracing of Curve A to the origin.

As Curve B shows, the "hard" superconductor traces the first portion of Curve A but at an applied field value well below $H_c$ exhibits a diminishing rate of increase in magnetization. This occurs at the point marked $H_{fp}$, signifying that this is where magnetic flux penetration into the superconductor first takes place. Flux penetration increases as the applied field is increased until the superconducting state is finally completely quenched at $N_N$. At that magnitude of applied field, penetration of magnetic flux into the superconducting material is complete and no residual portion of the body of this material remains superconducting. If thereafter the applied field is slowly diminished, the superconducting state reappears but the magnetization of the superconducting material or body is not the same in value or level at any applied field below $H_N$ is it originally was. In other words, the portion of Curve B from zero to $H_N$ is not retraced and in fact, the point zero, i.e. the origin, is not reached even though the applied field is removed completely. This means that the superconducting material in returning to its superconducting state has trapped magnetic flux within it so that in a sense the superconductor has the properties of a permanent magnet. The difference between magnetization in a rising field and that in a falling field, that is, the vertical distance between the upper and lower portions of Curve B, at any applied field value represents, as previously indicated, the current-carrying capacity of the superconductor. Thus, the new superconducting intermetallic compounds of this invention uniquely combine high $H_N$ value and large magnetization value differential or hysteresis and so are characterized by Curve B.

In the application of the foregoing inventions and discoveries as principles or rules governing the selection of the parent metals and solute metals and the formulation of binary and higher alloys for the production of the present new intermetallic compounds, the transition metals of Group V of the Periodic Table, that is, niobium, vanadium and tantalum, and technetium of Group VII, are the only major or parent elements. The solute metals, however, are not so limited in number, a criterion for selection of preferred metals in the formulation of reagent alloys being that one of the solute metals has an atom diameter larger than that of the parent metal atom by at least 0.05 Angstrom.

Still another criterion comes into play, as will subsequently be explained in detail, so that the choice of solute metals is not unrestricted beyond the foregoing preference requirement. Thus, where high current-carrying capacity under superconducting conditions is the objective, two requirements are of special significance. First, there must be a large concentration of extended defects in the superconducting material. Secondly, it is necessary that the material have an upper critical field, $H_N$, as high as possible. The defects, according to this invention, are additional to those caused by dislocation, stacking faults, grain boundaries and the like resulting from the usual preparation and processing of metallic materials. Thus, the addition of large solute atoms in the production of alloys of niobium, vanadium and tantalum results in a higher density of extended defects in the lattice. Conversely, the use of alloying elements, i.e., solutes having atom diameters approximating or smaller than that of the parent metal, tend to materially decrease or impair desirable properties of the superconducting material. In such alloys the density of the filamentary network or extended flaws is diminished or repressed with the ersult that current-carrying capacity and hysteresis effects in the superconducting material are inferior to these properties in the superconducting materials of this invention.

While the relative size of the solute atoms is important in the foregoing considerations, it also has a material effect as a general proposition on the upper critical field value of a given alloy. In the fabricating of superconducting materials which have both high upper critical field, $H_N$, and high current-carrying capacity, a large density of extended flaws will be desirable or necessary in the material. The density of the filamentary network comprising these flaws may be increased by cold working and by reducing the grain size of the intermetallic compound in addition to incorporating only relatively large solute atom materials as the alloying elements. The superconducting critical temperature value of an intermetallic compound is also materially affected, that is, increased, through the use of relatively large atom solute metal.

Further, as generally stated above, the solute metal should be selected to maximize within practical considerations the coefficient of the linear term of the electronic specific heat of the ultimate reagent alloy. Also, the selection of the solute element should be made with regard to the resistivity of the solute metal in its normal state. In other words, the solute metal preferably should have, with respect to the parent metal, a free electron-atom ratio differing by an order of at least two. Consequently, in a binary reagent alloy, the valence of the parent metal and the solute metal will differ by an order of at least two, while in ternary and higher reagent alloys, the criterion may be applied to the solute metals for two of them only and need not be concerned with the parent metal valence or free electron-atom ratio.

Putting this last criterion into specific terms for purposes of further explanation of this essential feature of my invention, the following formulation may be used in the preparation of a ternary reagent alloy useful in the production of an intermetallic compound having the aforesaid new characteristics and properties:

$$\frac{e}{a}=(5)_{\text{col.}5}+[A]\left[(-1)-\frac{\delta\Omega}{\Omega}5\right]_{\text{col.}4}+[B]\left[1-\frac{\delta\Omega}{\Omega}5\right]_{\text{col.}6}=4.5 \text{ ternary alloy}$$

in which A represents the atom fraction of solute metal A selected from column 4 of the Periodic Table and B represents the atom fraction of solute metal B selected from column 6 of the said table. Ω is a quantity proportional to the volume of the unit cell of the base metal, that is niobium, vanadium and tantalum (represented by (5) in the above formula), or technetium (represented by (7) in this formula), and δΩ is proportional to difference in volume between unit cell of the matrix or parent metal and that of the solute. This same kind of formulation applies to higher alloys, additional elements being factored in as [C], [D], etc. with appropriate values. Substituting in this formulation for a vanadium-titanium alloy and a vanadium-molybdenum alloy leads to the composition illustrated in Table I where $\rho_n$ was increased in the ternary over that observed in the binary yet $\gamma$ was kept at a maximum value for both alloys.

TABLE I

| Alloy | $e/a$ | cal $\gamma$ mol deg² | $\rho$(μohm-cm) | $a_0$ | $H_N$ (4.2° K.) |
|---|---|---|---|---|---|
| $V_{.8}Ti_{.2}$ | 4.5 | $27.3\times10^{-4}$ | 30 | 3.0815 | 47,540 |
| $V_{.7}Ti_{.2}Mo_{(.1)}$ | 4.5 | $27.3\times10^{-4}$ | 36 | 3.0850 | 57,390 |

Thus, it will be understood that by virtue of this invention concept the normal state resistivity value can be increased and at the same time $\gamma$ is optimized. The valence difference between the two solute atoms is 2 but could be made larger if the metallurgy of the system will permit it. The important thing is to maximize the difference in valence to the extent that this is possible while the maximum value of $\gamma$ is maintained. The reason for making the difference in valence or $e/a$ ratio as large as possible, is that the resistivity change which also should be maximized is proportional to the square of this difference.

The superconducting properties of the new intermetallic compounds of this invention are generally to some extent related to the superconducting characteristics of the alloy from which they are produced. Thus, I have found that when niobium-base, solid solution, binary alloys are reacted with tin, the critical current (in a high magnetic field) of the resulting reaction product varies with composition in a way similar to the way the critical temperature of the unreacted binary alloy varied with composition. This behavior is illustrated in FIGS. 2 and 3, the alloys of FIG. 3 being used in the production of the intermetallic compounds of FIG. 2, as will subsequently be described in detail.

Figure 2:
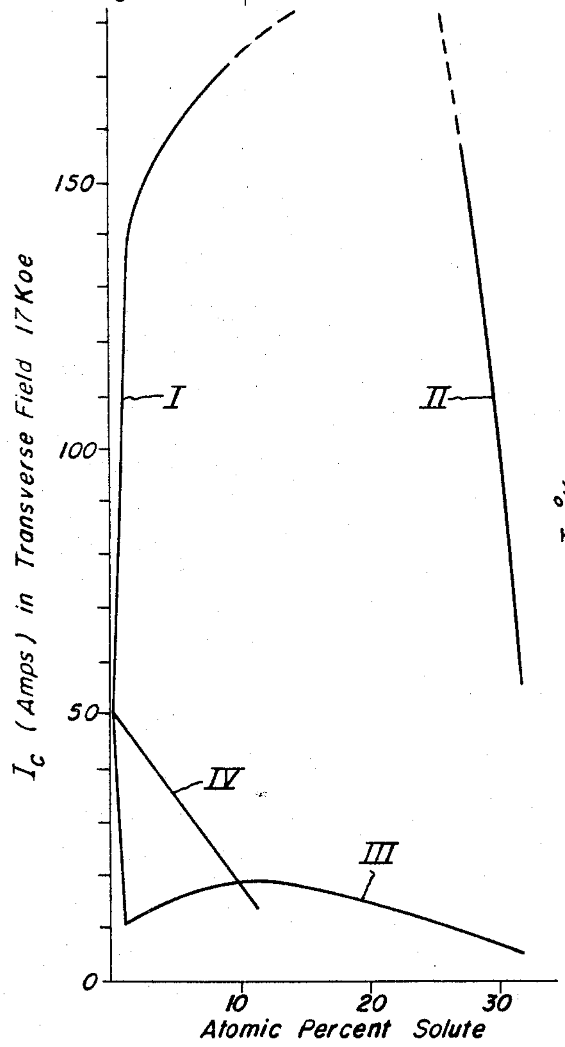
FIG. 2 is a chart on which superconducting critical current in amperes in a transverse field of 17 kilo-oersteds is plotted against atomic percent of solute for titanium, tungsten and zirconium binary solid solution alloys subjected to contact with molten tin at 960° C. for one hour.

Curve I of FIG. 2 represents a series of niobium-base zirconium alloys containing amounts of zirconium from approximately one atomic percent to more than ten atomic percent, while Curve II represents higher zirconium-content alloys of niobium ranging from 25 to 30 atomic percent zirconium. A maximum $I_c$ value is apparently obtained at about 20 atomic percent zirconium. Curve III represents a series of niobium-base titanium alloys containing up to 30 atomic percent titanium, and Curve IV represents another series of niobium alloys containing tungsten as the solute metal in amounts up to ten atomic percent. In all these cases, the test specimens were produced in the same manner in respect to the tin treatment operation. Specifically, this treatment was carried out in the manner described in Example I of my copending application, Ser. No. 149,590, filed Nov. 2, 1961, and assigned to the assignee hereof, the alloy specimens being provided for this phase of the process in the form of wires produced in the manner hereinabove described.

Figure 3:
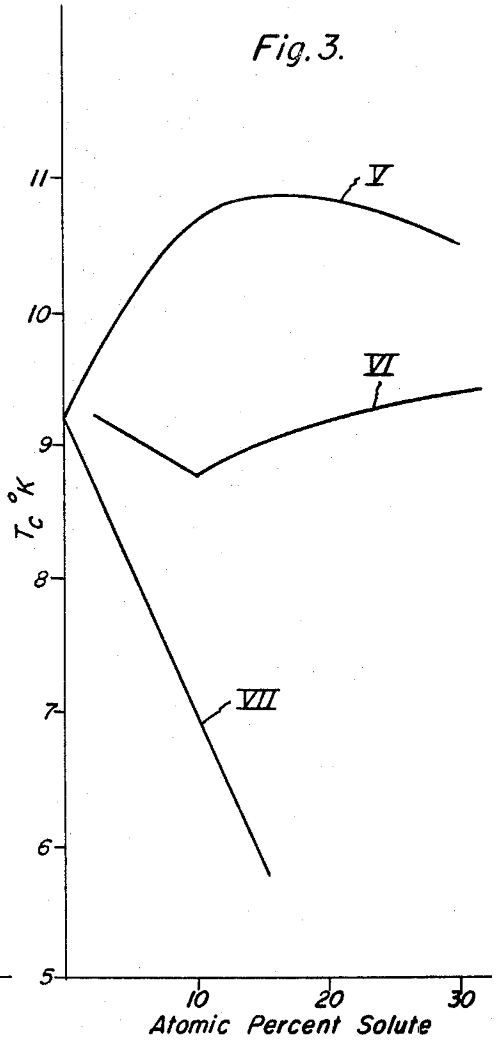
FIG. 3 is a plot of data obtained in tests of the alloys of FIG. 2 prior to tin contact, showing the effect of the solutes in varying proportions on the critical temperature.

FIG. 3 bears Curves V, VI, and VII which represent, respectively, the alloy series of Curves I, III and IV, except that instead of being wire specimens coated with tin, these were in the form of ingots or buttons and had not been treated with tin or other reagent metal prior to testing. These data, like those depicting the superconducting critical current as set out in FIG. 2, indicate a strong effect which is exerted by the solute or alloying element in each instance, depending upon the relative size of the atom of the solute metal. In the case of the tungsten alloys, however, the depression of the superconducting critical temperature is not nearly as marked as the depression of the superconducting critical current, and in view of the other results obtained, as shown on these charts, there is no explanation apparent for a difference of such large proportions.

The effect of solute metals in various niobium alloys employed in the production of intermetallic compound reaction products of this invention is shown in FIG. 4 where Curve VIII represents arc-melted niobium in as-received condition. Curve IX represents an 0.9 atomic percent zirconium-content niobium-base zirconium alloy. The effect of antimony in 0.4 atomic percent amount in a niobium-base antimony alloy is represented by Curve X, and the effect under similar conditions of $5\times10^{-3}$ atomic percent bismuth in solid solution in niobium is shown in Curve XI. As in the case of the FIG. 2 specimens, those of this series were in the form of wires and the tin treatment of them to form the intermetallic compound reaction product was precisely as set out above.

The beneficial effect of larger atom diameter solutes is strikingly shown by the FIG. 4 curves which establish substantially higher current-carrying capacity where bismuth and antimony are substituted for zirconium in these niobium binary solid solution alloys.

The particular reagent metals contemplated by this invention for production of the new intermetallic compound reaction products include aluminum, silicon and gallium in addition to tin. The alloys contemplated by this invention for use in the production of this new reaction product type are those of niobium, vanadium, tantalum and technetium. Typical examples of reagent ternary and higher alloys for use in the production of the present new intermetallic compounds not specifically identified in reference to the data depicted by the curves of various charts herein include the following:

- Niobium-base alloy containing a minor proportion of zirconium and molybdenum;
- Niobium-base alloy containing a minor proportion of zirconium, uranium and rhenium;
- Vanadium-base alloy containing a minor proportion of titanium and molybdenum;
- Vanadium-base alloy containing a minor proportion of zirconium and molybdenum wherein the proportion of vanadium exceeds the aggregate of the amounts of zirconium and molybdenum;
- Niobium-base alloy containing zirconium and uranium wherein the amount of uranium exceeds the aggregate of the two solute metals;
- Niobium-base alloy of zirconium, uranium and rhenium wherein the niobium exceeds the aggregate amount of the other metals;
- Niobium-base alloy containing zirconium, uranium, molybdenum and rhenium.

So that those skilled in the art will be able to better understand and practice the invention and so that they will be able to avoid the necessity for undue experimentation, the following illustrative, but not limited, examples of actual operations of this invention are set out in detail:

Example I

Electron beam melted niobium obtained on the open market was melted down and mixed thoroughly with zirconium metal of reagent grade in the ratio of 9.5 atomic percent zirconium, balance niobium, and the resulting alloy was cast, machined into cylinders approximately 3/16 inch diameter which were then swaged and drawn to provide a wire of substantially uniform diameter as small as 0.030 inch. Segments of this wire were treated further with tin to produce intermetallic compound reaction products with the object of testing these against other untreated segments of this wire for critical current and critical temperature values and $H_N$ magnetic behavior such as hysteresis effects.

The tin treatment was conducted according to two different procedures, some of the samples being subjected to contact with liquid or molten tin while others were contacted with tin vapor. In the molten tin treatment or liquid diffusion process, wires of the niobium-zirconium alloy were placed in a quartz tube following their careful cleaning with emery and wiping with benzene and the tube was filled with chips of pure tin and evacuated at room temperature to a pressure of $10^{-6}$ mm. of mercury or less. While under high vacuum, the tube was heated to 300° C. and maintained at that temperature for three hours and then permitted to cool to room temperature, which required about one-half hour. The tube was then sealed off while vacuum was maintained and was placed in a large furnace guaranteeing uniform temperature throughout the length of the wire samples and the tube assembly. In that furnace, the temperature of the assembly was raised to 960° C. and maintained there for one hour and then air-cooled to room temperature and the tube was opened and placed in hot silicone oil, the temperature of which was slightly above the melting point of the temperature of tin. The wire samples proved upon removal from the tube to be well tinned and electrical leads for subsequent tests were readily attached to them.

In the vapor diffusion process of tin treatment, wire specimens prepared as described just above were placed in a quartz tube in the bottom of which, below the lower ends of the wires, was a supply of tin in the form of chips. The tube was evacuated to a pressure of less than $10^{-6}$ mm. of mercury, then heated to 300° C. and maintained at that temperature for two hours and then allowed to air-cool to room temperature. At that point, with the vacuum still maintained, the tube was sealed, placed in a furnace and heated to 960° C. and maintained at that temperature for 17 hours. Thereafter, the tube was air-cooled and opened and the wire specimens, well tinned, were removed for attachment of leads and testing.

The critical current, i.e. the current-carrying capacity of these specimens was measured at 4.2° K. by passing an electric current through them in a transverse magnetic field and noting potentiometrically when at a given field a potential of about 0.1 microvolt began to appear due to the onset of quenching by the superconducting current. The field was provided by a small iron core magnet wound by 0.004 inch insulated niobium wire.

The superconducting critical temperature of these specimens was determined by a resistometric method to a sensitivity of about 0.01° K. In the region between 4° K. to 10° K., two methods for stabilizing and determination of temperatures were used, a controlled heat leak method providing a reproducibility to ±0.001° K. and an activated charcoal-helium gas adsorption method proving accurate to about ±0.05° K. In the region from 10° K. to 20° K., a vapor pressure of hydrogen was used as a temperature reference, while in the region from 1° K. to 4° K., the vapor pressure of helium was used in the same manner. These methods are recognized standards for tests in the art and were used here interchangeably as necessary or desirable in obtaining results indicated elsewhere in the specification and in the accompanying drawings.

Magnetization measurements on these intermetallic reaction product samples were accomplished by flipping specimens of approximately 3/16 inch diameter and of uniform length about ½ inch in and out of a coil coaxial with an external steady field. This coil was connected to a flux meter whose deflection was then proportional to the specimen under test. This likewise is a procedure heretofore known to and used for this general purpose by those skilled in the art.

The results of the foregoing tests are points on Curves I and V of FIGS. 2 and 3, and in the case of the magnetization tests, the data obtained are represented by Curve XII of FIG. 9.

Example II

In another operation like that described in Example I, a niobium alloy containing 0.9 atomic percent zirconium was prepared in similar high purity form and resulting wire segments were treated with tin, as also set out in Example I, and then subjected to test to determine the critical current of this alloy in bulk form in an applied field over the range from 7000 to about 17,000 kilooersteds. The results of this test carried on in the manner described in Example I are represented by Curve IX of FIG. 4.

Example III

Again, in a repetition of the procedure described in Example I, a niobium-bismuth alloy containing $5\times10^{-3}$ atomic percent of bismuth was prepared and treated with tin as described above and the resulting wire segments were subjected to tests as described above with the results indicated by Curve XI of FIG. 4.

Example IV

A niobium-antimony alloy containing 0.4 atomic percent of antimony and being of a purity comparable to the alloys of Example I was prepared by the melt-down procedure described in detail in Example I. Again, this alloy was cast and swaged and drawn, as described above, to provide wire test segments which were treated with tin and subjected to the foregoing critical current tests, with the results depicted by Curve X of FIG. 4.

A comparison between the atom size and the amounts of zirconium, bismuth and antimony in the alloys of Examples II, III and IV indicates clearly the significant effect of the atom size factor upon critical current or current-carrying capacity.

Example V

For purposes of the foregoing comparisons, a blank was run in the form of as-received niobium which was melted down and converted to the form of test wires which were tin treated as described in the foregoing examples. The results of the tests on this blank or control sample are represented by Curve VIII of FIG. 4.

The quantity or proportion or amount of the solute or solute metals employed according to this invention in the production of these new superconducting intermetallic compounds is that amount which in the binary alloy will produce a measurable increase in the superconducting critical temperature of the alloy over the parent metal. By "measurable increase" is meant and intended an increase of at least 0.1° K. Generally, this much change in the superconducting critical temperature in increasing the temperature of the parent metal will require an excess of two atomic percent of the solute metal, but it will be understood that this will vary to some degree with the different parent metals and solutes.

The upper limit or maximum amount of solute metal or metals in these alloys is the solubility limit of them up to 49 atomic percent. Accordingly, the general definition of these materials in the appended claims provides that these alloys are solid solution alloys and further provides that the parent metal is the major constituent in every instance. It will be understood, however, that optimum amounts of solute metal or metals will normally be somewhat less than the solubility limit, there being other significant considerations such as maximizing of the coefficient of the linear term of the specific heat of the alloy. Thus, as indicated previously herein, more of a Group V metal normally should be present in these alloys used in the production of the new intermetallic compounds than either Group IV or Group VI metals. There is as a general proposition a maximum value between Groups IV and V which is closer to Group V and there is a minimum value between Groups V and VI which is nearer the latter. But because of exceptions to these generalizations and because of the different patterns of specific heat values in the cases of Group VI and Group VII metals, inflexible ratios should not be fixed for the metal components of the various systems within the scope of this invention and variations in relative amounts of metals are contemplated for the attainment of different results where requirements vary.

As previously generally indicated herein, only solid solution alloys are contemplated by this invention as reagents for the production of the new intermetallic compounds. Preferably these will be homogeneous solid solution alloys. However, the claims cover and the invention contemplates multiphase products such as the various intermetallic compound reaction products and mixtures specifically described above and, in fact, such products will generally be found to have very high current-carrying capacities.

Where in this specification and in the appended claims amounts, proportions or other measures are stated, reference is made to the atom percent or atom fraction basis rather than to the volume basis or to any other basis unless the contrary is expressly stated.

Having thus described this invention in such full, clear, concise and exact terms as to enable any person skilled in the art to which it pertains to make and use the same, and having set forth the best mode contempleted of carrying out this invention, I state that the subject matter which I regard as being my invention is particularly pointed out and distinctly claimed in what is claimed, it being understood that equivalents or modifications of, or substitutions for, part of the specifically-described embodiments of the invention may be made without departing from the scope of the invention as set forth in what is claimed.

What I claim as new and desire to secure by Letters Patent of the United States is:

1. A superconductive material having a high critical field and a high current-carrying capacity comprising an intermetallic compound reaction product of a metal selected from the group consisting of tin, aluminum, silicon and gallium with a solid solution alloy of niobium, tantalum, titanium or vanadium and a minor proportion of at least two metals selected from the group consisting of zirconium, molybdenum, uranium and rhenium, two metals of said alloy being present in ratio to each other providing a maximum value of the coefficient of the linear term of the electronic specific heat of the alloy.

2. The superconductive material as described in claim 1 in which the alloy is a ternary alloy of niobium, zirconium and molybdenum, and the zirconium and molybdenum are present in proportion to each other providing a maximum value of the coefficient of the linear term of the electronic specific heat of the alloy.

3. The superconductive material described in claim 1 in which the alloy is a quintary alloy of niobium and a minor aggregate proportion of the four solute metals including zirconium, uranium, molybdenum and rhenium, two of said solute metals being present in ratio to each other providing a maximum value of the coefficient of the linear term of the electronic specific heat of the alloy.

References Cited

UNITED STATES PATENTS

| | | | |
|---|---|---|---|
| 3,028,341 | 4/1962 | Rosi. | |
| 3,181,936 | 5/1965 | Denny | 29—194 |
| 3,244,490 | 4/1965 | Saur | 29—194 |
| 3,266,950 | 8/1966 | Zwickev. | |
| 3,317,286 | 5/1967 | De Sorbo | 29—194 |

HYLAND BIZOT, *Primary Examiner.*

U.S. Cl. X.R.

29—194; 75—134, 175.5